United States Patent
Zhao et al.

(10) Patent No.: US 9,490,211 B1
(45) Date of Patent: Nov. 8, 2016

(54) COPPER INTERCONNECT

(71) Applicant: Lam Research Corporation, Fremont, CA (US)

(72) Inventors: Lie Zhao, Lake Oswego, OR (US); Artur Kolics, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/747,949

(22) Filed: Jun. 23, 2015

(51) Int. Cl.
*H01L 21/00* (2006.01)
*H01L 23/532* (2006.01)
*H01L 21/768* (2006.01)
*H01L 21/02* (2006.01)
*H01L 23/522* (2006.01)

(52) U.S. Cl.
CPC ... *H01L 23/53238* (2013.01); *H01L 21/02118* (2013.01); *H01L 21/02164* (2013.01); *H01L 21/76802* (2013.01); *H01L 21/76843* (2013.01); *H01L 21/76879* (2013.01); *H01L 23/5226* (2013.01)

(58) Field of Classification Search
CPC ............... H01L 23/53238; H01L 21/76802; H01L 21/76843
See application file for complete search history.

(56) References Cited

U.S. PATENT DOCUMENTS

| | | |
|---|---|---|
| 6,878,621 B2 | 4/2005 | Wu et al. |
| 7,573,061 B1 | 8/2009 | Yu et al. |
| 7,755,192 B2 | 7/2010 | Koike et al. |
| 8,053,861 B2 | 11/2011 | Mountsier et al. |
| 2004/0061160 A1 | 4/2004 | Kumagai et al. |
| 2005/0110142 A1 | 5/2005 | Lane et al. |
| 2007/0281475 A1 | 12/2007 | Clark et al. |
| 2008/0057198 A1* | 3/2008 | Yoon ............... H01L 21/0206 427/250 |
| 2008/0242088 A1 | 10/2008 | Suzuki |
| 2009/0315182 A1 | 12/2009 | Besser et al. |
| 2012/0153483 A1 | 6/2012 | Akolkar et al. |
| 2012/0161320 A1* | 6/2012 | Akolkar ......... H01L 21/76883 257/751 |

FOREIGN PATENT DOCUMENTS

WO    WO 02/058112    7/2002

* cited by examiner

*Primary Examiner* — Laura Menz
(74) *Attorney, Agent, or Firm* — Beyer Law Group LLP

(57) ABSTRACT

A method of filling features in a dielectric layer is provided. A pure Co or pure Ru adhesion layer is deposited against surfaces of the features, wherein the adhesion layer is separated from some of the surfaces of the features of the low-k dielectric layer by no more than 10 Å. The features are filled with Cu or a Cu alloy.

17 Claims, 5 Drawing Sheets

COPPER INTERCONNECT

BACKGROUND OF THE INVENTION

Field of the Invention

The invention relates to a method of forming semiconductor devices on a semiconductor wafer. More specifically, the invention relates to forming copper interconnects in low-k dielectric layers.

In forming semiconductor devices, dual damascene copper interconnects are placed in low-k dielectric layers. This may be done by depositing copper or a copper alloy into features etched into the low-k dielectric layer. The deposited copper may be deposited by electrodeposition or by electroless deposition.

SUMMARY OF THE INVENTION

To achieve the foregoing and in accordance with the purpose of the present invention, a method of filling features in a dielectric layer is provided. A pure Co or pure Ru adhesion layer is deposited against surfaces of the features, wherein the adhesion layer is separated from some of the surfaces of the features of the low-k dielectric layer by no more than 10 Å. The features are filled with Cu or a Cu alloy.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the formation of copper interconnects, dual damascene features of trenches and vias are etched into a dielectric layer. Normally, a barrier layer containing tantalum or some other barrier material is used to fill the features, before the features are filled with copper. The barrier layer is used to protect the dielectric from copper diffusion into the dielectric and for other purposes. The tantalum based barrier in the copper interconnects significantly reduces the cross-section area of the copper, as the interconnect dimensions get smaller and smaller, which leads to an exponential increase of the copper line resistance.

Figure 1:
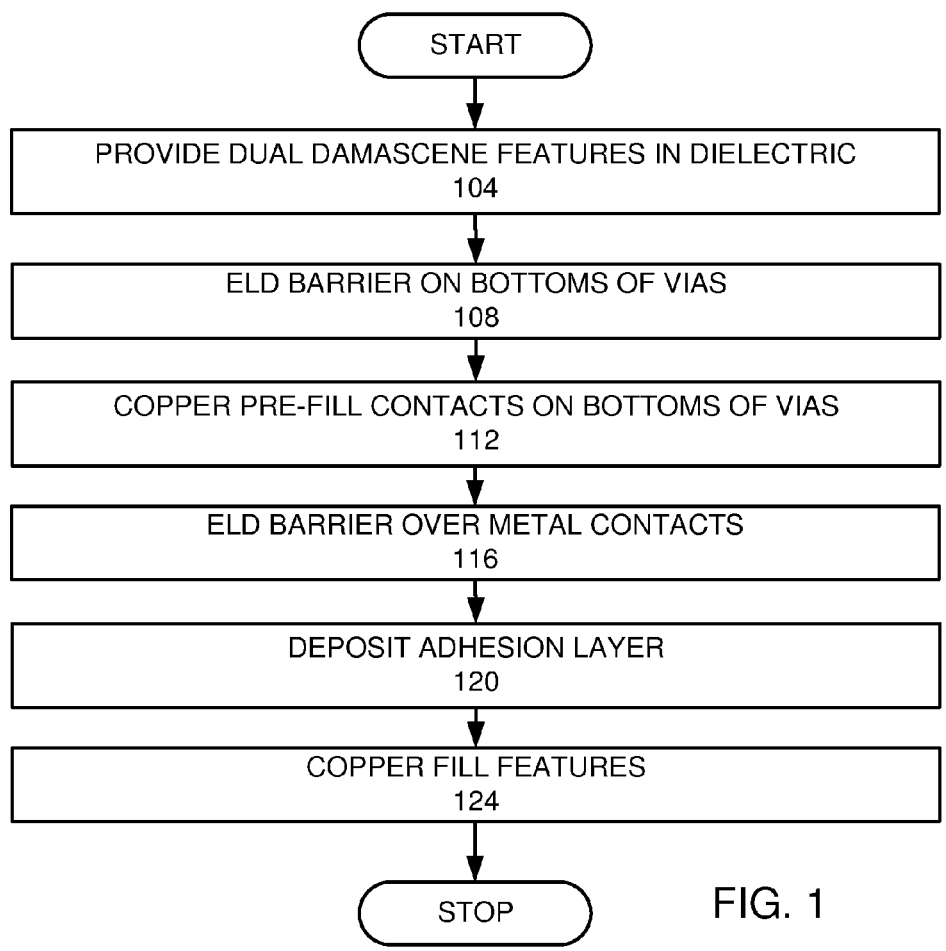
FIG. 1 is a high level flow chart of an embodiment of the invention.

FIG. 1 is a high level flow chart of an embodiment of the invention. In this embodiment, a substrate with a dielectric layer with dual damascene features of vias and trenches is provided (step 104). A barrier layer is selectively deposited on the bottoms of the vias (step 104). Copper contacts are electrolessly deposited (ELD) on bottoms of the vias over the barrier layer (step 112). A barrier layer is formed over the copper contacts (step 116). An adhesion layer is formed in the features (step 120). The remaining features are filled with copper (step 124).

Figure 2A:
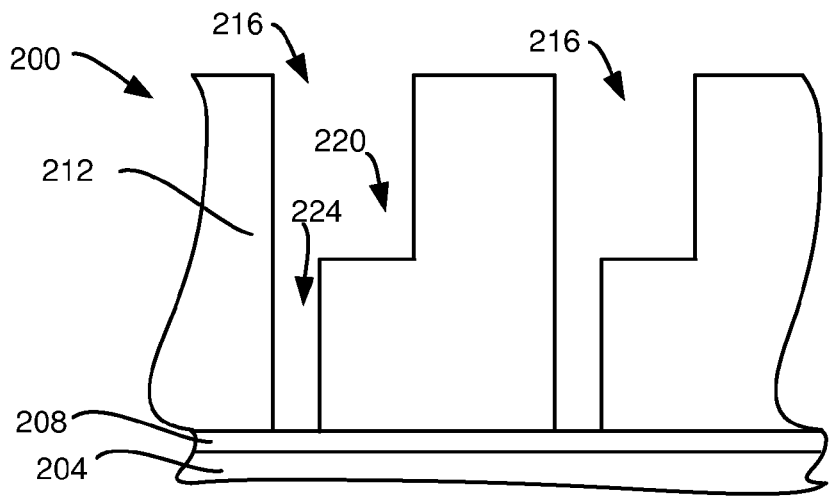
FIGS. 2A-F are schematic views of the formation of structures using the inventive process.

In a preferred embodiment of the invention, a substrate with a dielectric layer with dual damascene features of vias and trenches is provided (step 104). FIG. 2A is a schematic cross-sectional view of a stack 200 with a substrate 204 with a metal layer 208 under a dielectric layer 212. There may be one or more layers between the substrate 204 and the metal layer 208. The metal layer 208 may be a continuous layer or a patterned layer in a dielectric layer. There may be one or more layers between the metal layer 208 and the dielectric layer 212. Dual damascene features 216 have been etched into the dielectric layer 212. The dual damascene features 216 comprise vias 224, which are etched completely through the dielectric layer 212, and vias 220, which are only partially etched trough the dielectric layer 212. In this embodiment, the dielectric layer is a low-k dielectric layer of either a carbon doped silicon oxide or an organic polymer layer. In addition, the bottoms of the vias are in electrical contact with the metal layer 208. Preferably, the vias are etched completely through to the metal layer 208.

Figure 2B:
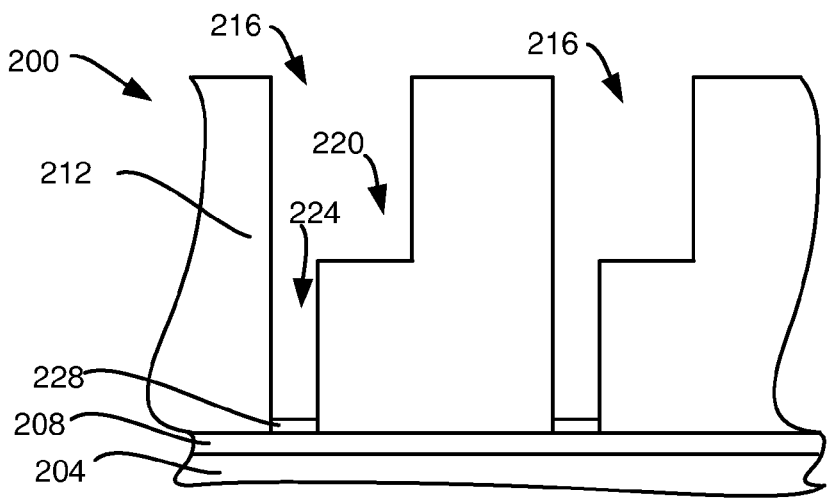

A barrier layer is selectively deposited on bottoms of the vias (step 108). In this embodiment, the selective deposition is provided by electroless deposition, which is possible, since the deposition is on a conductive layer. In this embodiment, the barrier layer comprises cobalt and tungsten. The barrier layer may further comprise boron, nickel, molybdenum, or phosphorous. FIG. 2B is a schematic cross-sectional view of the stack 200 after the barrier layer 228 has been selectively deposited on only bottoms of the vias 224.

Figure 2C:
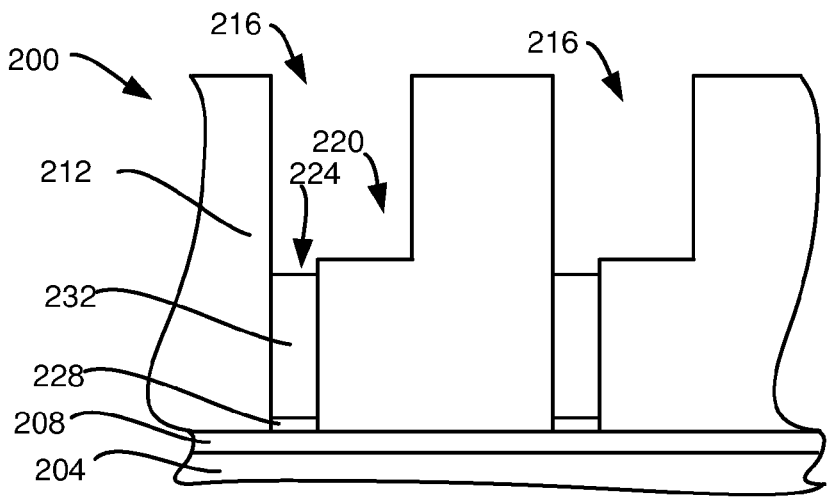

A copper pre-fill is provided to form contacts on the bottoms of the vias (step 112). In this embodiment the copper pre-fill is pure copper. In other embodiments, the copper pre-fill may be copper with small amounts of other alloy materials. In this embodiment, the selective deposition is accomplished by electroless deposition. FIG. 2C is a schematic cross-sectional view of the stack 200 after the copper contacts 232 has been selectively deposited on only bottoms of the vias 224. In another embodiment, a cobalt pre-fill may be used instead of the copper pre-fill.

Figure 2D:
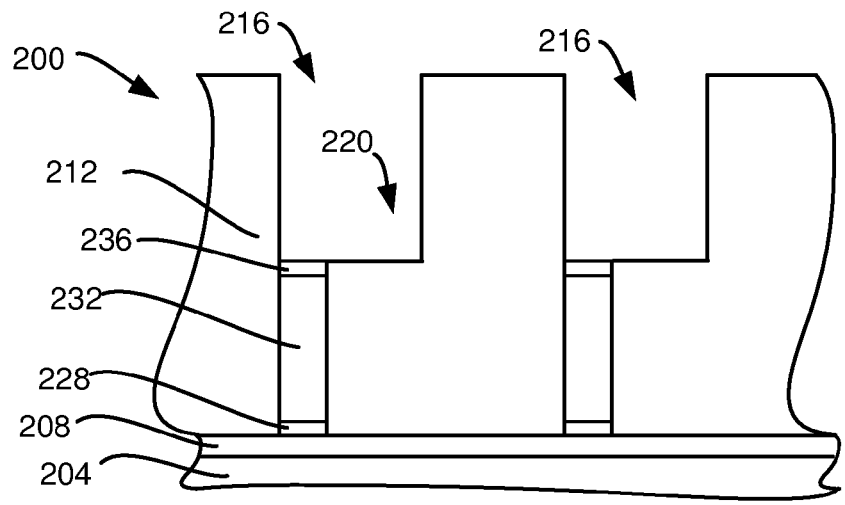

A top contact barrier layer is selectively deposited over the copper contacts (step 112). In this embodiment, the selective deposition is provided by electroless deposition. In this embodiment, the barrier layer comprises cobalt and tungsten. The barrier layer may further comprise boron or phosphorous. FIG. 2D is a schematic cross-sectional view of the stack 200 after the top contact barrier layer 236 has been selectively deposited on the copper contacts 232.

An adhesion layer is deposited within the features (step 120). Preferably, the adhesion layer is cobalt or ruthenium.

Figure 2E:
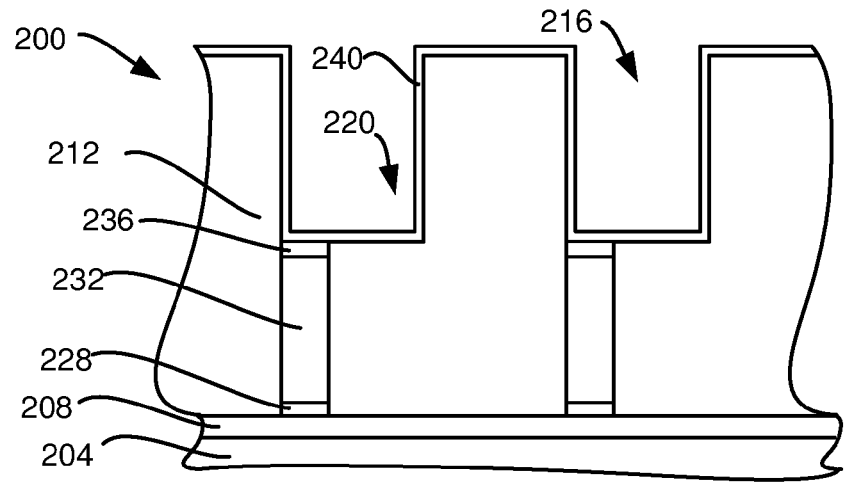

More preferably, the adhesion layer is pure cobalt or pure ruthenium. Preferably, the adhesion layer has a thickness in the range of 10 to 30 Å. Preferably, the adhesion layer is formed by chemical vapor deposition (CVD) or atomic layer deposition (ALD). Preferably, the adhesion layer is no more than 10 Å away from the low-k dielectric layer of the walls of the trenches. More preferably, the adhesion layer is deposited directly against the low-k dielectric layer on the walls and bottoms of the trenches. FIG. 2E is a schematic cross-sectional view of the stack 200 after the adhesion layer 240 has been deposited (step 120).

The thickness of the pure cobalt or ruthenium adhesion layer being in the range of 10 to 30 Å results in a continuous layer, which prevents copper electromigration. If the pure cobalt or ruthenium adhesion layer does not have sufficient adhesion to the dielectric layer 212, because of the particular dielectric material, then an additional adhesion layer of another material may be formed on the dielectric layer 212 before forming the pure cobalt or ruthenium adhesion layer. The additional adhesion layer does not need to be continuous and therefore is less than 10 Å in thickness. This results in the pure copper or ruthenium adhesion layer being less than 10 Å from the dielectric layer 212.

Figure 2F:
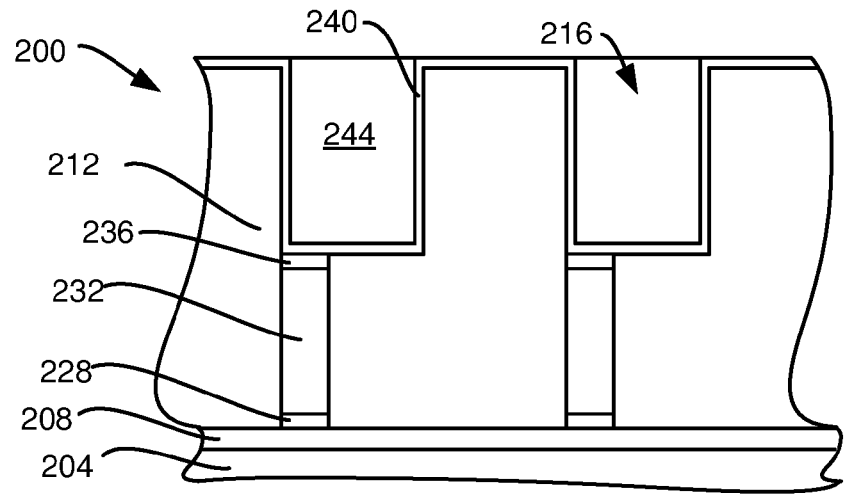

The features are copper filled (step 124). The copper filling may be by ELD or electroplating or by some other method. In this embodiment the copper fill is pure copper. In other embodiments, the copper fill may be copper with small amounts of other alloy materials. FIG. 2F is a schematic cross-sectional view of the stack 200 after the features have been filled with copper fill 244 (step 124).

The barrier layers help prevent electromigration of the copper. The barrier layers may also improve copper adhesion. This embodiment fills the vias with the copper contacts 232, so that the copper contacts are in direct contact with the low-k dielectric 212, without a barrier layer. This allows an increased copper contact cross-section, while preventing copper diffusion, because the low-k dielectric is either a carbon doped silicon oxide or an organic polymer.

Figure 3:
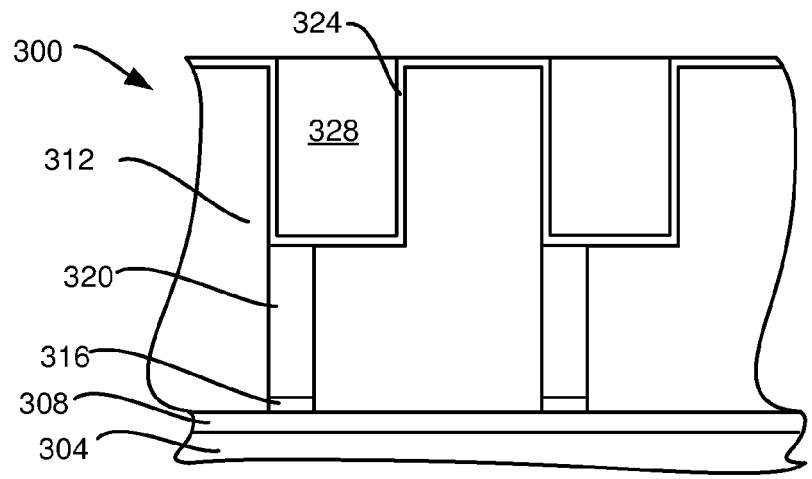
FIG. 3 is a schematic view of the formation of structures using another embodiment.

In another embodiment of the invention, the step of forming the barrier on top of the copper contact pre-fill (step 116) is omitted. In such a process, the providing the substrate with dual damascene features (step 104), forming a barrier layer on the bottoms of the vias (step 108), the depositing the copper contact pre-fill (step 112), the depositing the adhesion layer (step 120), and the copper filling the features (step 124) are the only steps performed. FIG. 3 is a cross-sectional view of a stack 300, with copper filling formed by this process. The stack 300 comprises a substrate 304 with a metal layer 308 under a dielectric layer 312, a barrier layer 316 on the bottom of the vias, a copper contact pre-fill 316, with an adhesion layer 324 directly deposited on the dielectric layer 312 within the entire surface of the trenches, and a copper fill 328 filling the remainder of the features.

Figure 4:
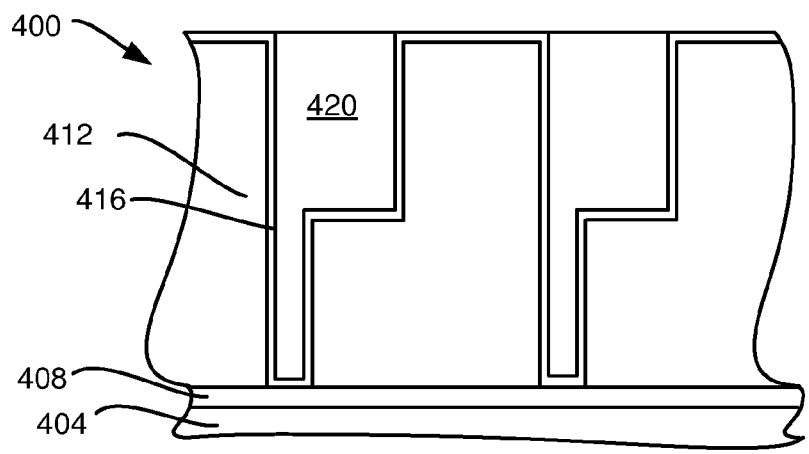
FIG. 4 is a schematic view of the formation of structures using another embodiment.

In another embodiment of the invention, the steps of forming the barrier on bottoms of the vias (step 108), the copper pre-fill (step 112), and the forming the barrier over the contacts (step 116) are omitted. In such a process, the providing the substrate with dual damascene features (step 104), the depositing the adhesion layer (step 120), and the copper filling the features (step 124) are the only steps performed. FIG. 4 is a cross-sectional view of a stack 400, with copper filling formed by this process. The stack 400 comprises a substrate 404 with a metal layer 408 under a dielectric layer 412, with an adhesion layer 416 directly deposited on the dielectric layer 412 within the entire surface of the features, and a copper fill 420 filling the remainder of the features.

In this embodiment, by omitting various steps, the resulting process is simpler and quicker. However, the pre-filling the via in the previous embodiment makes the copper fill of the trenches easier. In addition, the placement of the adhesion layer within the vias reduces the cross-sectional area of the copper within the vias.

Figure 5:
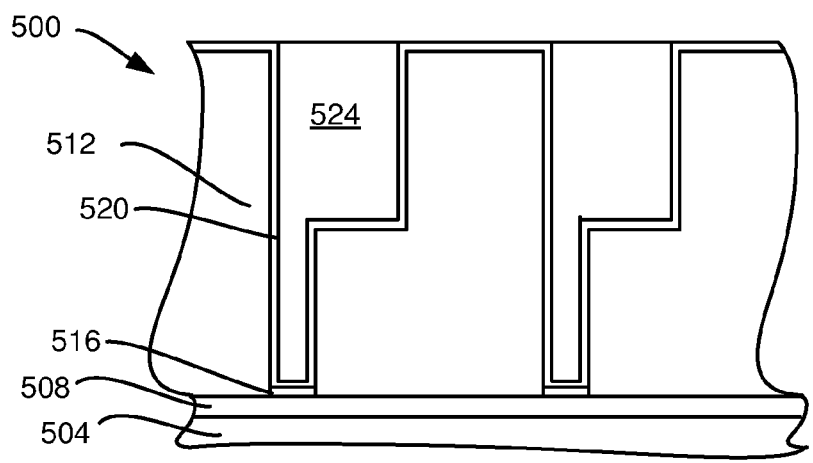
FIG. 5 is a schematic view of the formation of structures using another embodiment.

In another embodiment of the invention, the copper contact pre-fill (step 112) and the forming the barrier layer over the contacts (step 116) are omitted. In such a process, the providing the substrate with dual damascene features (step 104), the forming the barrier layer only on the bottom of the vias (step 108), the depositing the adhesion layer (step 120), and the copper filling the features (step 124) are the only steps performed. FIG. 5 is a cross-sectional view of a stack 500, with copper filling formed by this process. The stack 500 comprises a substrate 504 with a metal layer 508 under a dielectric layer 512, with a barrier layer 516 and an adhesion layer 520 directly deposited on the dielectric layer 512 within the entire surface of the features except at the bottom of the vias, and a copper fill 524 filling the remainder of the features.

Figure 6:
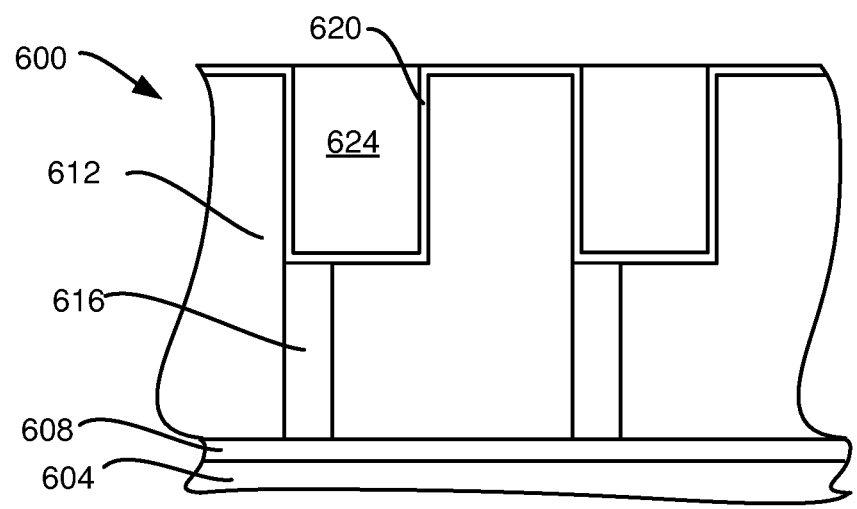
FIG. 6 is a schematic view of the formation of structures using another embodiment.

In another embodiment of the invention, the steps of forming the barrier on bottoms of the vias (step 108) and the forming the barrier over the contacts (step 116) are omitted. In such a process, the providing the substrate with dual damascene features (step 104), the depositing the copper contact pre-fill (step 112), the depositing the adhesion layer (step 120), and the copper filling the features (step 124) are the only steps performed. FIG. 6 is a cross-sectional view of a stack 600, with copper filling formed by this process. The stack 600 comprises a substrate 604 with a metal layer 608 under a dielectric layer 612, a copper contact pre-fill 616, with an adhesion layer 620 directly deposited on the dielectric layer 612 within the entire surface of the trenches, and a copper fill 620 filling the remainder of the features.

In another embodiment of the invention, the steps of forming the barrier on bottoms of the vias (step 108) and the forming the barrier over the contacts (step 116) are omitted. In such a process, the providing the substrate with dual damascene features (step 104), the depositing the copper contact pre-fill (step 112), the depositing the adhesion layer (step 120), and the copper filling the features (step 124) are the only steps performed. FIG. 6 is a cross-sectional view of a stack 600, with copper filling formed by this process. The stack 600 comprises a substrate 604 with a metal layer 608 under a dielectric layer 612, a copper contact pre-fill 616, with an adhesion layer 620 directly deposited on the dielectric layer 612 within the entire surface of the trenches, and a copper fill 620 filling the remainder of the features.

Figure 7:
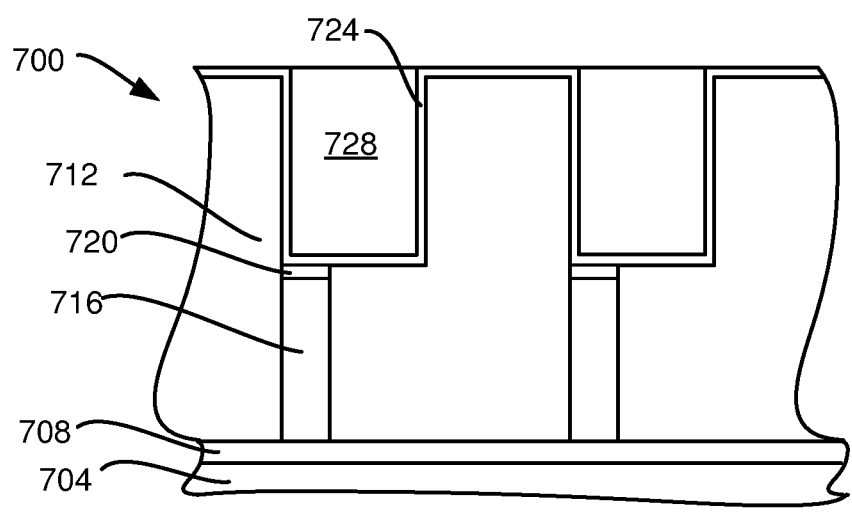
FIG. 7 is a schematic view of the formation of structures using another embodiment.

In another embodiment of the invention, the step of forming the barrier on bottoms of the vias (step 108) is omitted. In such a process, the providing the substrate with dual damascene features (step 104), the depositing the copper contact pre-fill (step 112), forming a barrier layer on top of the copper contacts (step 116), the depositing the adhesion layer (step 120), and the copper filling the features (step 124) are the only steps performed. FIG. 7 is a cross-sectional view of a stack 700, with copper filling formed by this process. The stack 700 comprises a substrate 704 with a metal layer 708 under a dielectric layer 712, a copper contact pre-fill 716, a barrier layer 720 on top of the contact 716, with an adhesion layer 724 directly deposited on the dielectric layer 712 within the entire surface of the trenches, and a copper fill 728 filling the remainder of the features.

In some embodiments the low-k dielectric is porous. In other embodiments, the low-k dielectric is not porous. In various embodiments the low-k dielectric is defined as a dielectric with a k value of less than 3.0. Some embodiments allow the copper to be deposited against the dielectric layer without a barrier layer in between. By eliminating the barrier layer between the copper and the low-k dielectric these embodiments allow sufficient room for the copper contacts at small feature widths. Generally, barrier layers between the copper and the dielectric have a high resistance, which reduces the cross-section of highly conductive materials. In some embodiments an additional adhesion layer of less than 10 Å is placed between the adhesion layer of cobalt or ruthenium.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of filling features in a dielectric layer, wherein the features comprise via features and trench features, and wherein metal contacts are at bottoms of the via features, comprising:
   selectively electrolessly depositing metal on the bottoms of the via features;
   depositing a pure Co or pure Ru adhesion layer against surfaces of the features, wherein the adhesion layer is separated from some of the surfaces of the features of the low-k dielectric layer by no more than 10 Å; wherein the selective electrolessly depositing metal on bottoms of the via features is before depositing the pure Co or pure Ru adhesion layer; and
   filling the features with Cu or a Cu alloy.

2. The method, as recited in claim 1, wherein the depositing the pure Co or pure Ru adhesion layer deposits the adhesion layer directly against some of the surfaces of the low-k dielectric layer.

3. The method, as recited in claim 2, wherein the dielectric layer is a low-k dielectric formed from carbon doped silicon oxide layer or an organic polymer layer.

4. The method, as recited in claim 3, wherein the selectively depositing metal on bottoms of the via features comprises selectively depositing a Cu or Cu alloy, so that Cu or Cu alloy is deposited directly against some surfaces of the low-k dielectric layer forming via features.

5. The method, as recited in claim 4, wherein the selectively depositing metal on bottoms of the via features further comprises selectively depositing a barrier layer.

6. The method, as recited in claim 5, wherein the adhesion layer is has a thickness in the range of 10 to 30 Å.

7. The method, as recited in claim 6, wherein the dielectric layer is over a metal layer, wherein the via features extend to the metal layer.

8. The method, as recited in claim 7, wherein the depositing the Cu or Cu alloy is by electroless deposition.

9. The method, as recited in claim 3, wherein the selectively depositing metal on bottoms of the via features comprises selectively depositing a barrier layer.

10. The method, as recited in claim 9, wherein the barrier layer comprises at least one of cobalt, tungsten, nickel, molybdenum, boron, or phosphorous.

11. The method, as recited in claim 3, wherein the selectively depositing metal on bottoms of the via features comprises selectively depositing a Co or Co alloy, so that Co or Co alloy is deposited directly against some surfaces of the low-k dielectric layer forming via features.

12. The method, as recited in claim 1, wherein the selectively depositing metal on bottoms of the via features comprises selectively depositing a Cu or Cu alloy, so that Cu or Cu alloy is deposited directly against some surfaces of the low-k dielectric layer forming via features.

13. The method, as recited in claim 12, wherein the selectively depositing metal on bottoms of the via features further comprises selectively depositing a barrier layer.

14. The method, as recited in claim 13, wherein the adhesion layer has a thickness in the range of 10 to 30 Å.

15. The method, as recited in claim 14, wherein the dielectric layer is over a metal layer, wherein the via features extend to the metal layer.

16. The method, as recited in claim 15, wherein the depositing the Cu or Cu alloy is by electroless deposition.

17. The method, as recited in claim 1, wherein the selectively depositing metal on bottoms of the via features comprises selectively depositing a barrier layer.

* * * * *